(12) United States Patent
Chan et al.

(10) Patent No.: US 9,190,536 B1
(45) Date of Patent: Nov. 17, 2015

(54) JUNCTION FIELD EFFECT TRANSISTOR (71) Applicant: Macronix International Co., Ltd., Hsinchu (TW)

(72) Inventors: Ching-Lin Chan, Yunlin County (TW); Cheng-Chi Lin, Yilan County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/296,497

(22) Filed: Jun. 5, 2014

(51) Int. Cl.
*H01L 29/74* (2006.01)
*H01L 31/111* (2006.01)
*H01L 29/808* (2006.01)
*H01L 29/08* (2006.01)
*H01L 29/10* (2006.01)

(52) U.S. Cl.
CPC .......... *H01L 29/808* (2013.01); *H01L 29/0843* (2013.01); *H01L 29/1058* (2013.01); *H01L 29/1095* (2013.01)

(58) Field of Classification Search
CPC ................... H01L 29/808; H01L 2924/13062; H01L 29/1058
USPC ........................... 257/134, 256, 370; 438/186
See application file for complete search history.

(56) References Cited

U.S. PATENT DOCUMENTS

| 5,412,234 A | * | 5/1995 | Schoofs et al. | 257/256 |
| 2012/0001240 A1 | * | 1/2012 | Yu | 257/256 |
| 2012/0280316 A1 | * | 11/2012 | Lin et al. | 257/335 |

* cited by examiner

*Primary Examiner* — Theresa T Doan
(74) *Attorney, Agent, or Firm* — McClure, Qualey & Rodack, LLP (57) ABSTRACT

A junction field effect transistor is disclosed. The junction field effect transistor includes a first doped region and a second doped region. The first doped region includes a source and a drain. The second doped region includes a gate. The first doped region and the second doped region have a U-shape PN junction there between. The U-shape PN junction is between the source and the drain.

20 Claims, 8 Drawing Sheets

JUNCTION FIELD EFFECT TRANSISTOR

BACKGROUND

1. Technical Field

The disclosure relates in general to a semiconductor structure, and particularly to a junction field effect transistor.

2. Description of the Related Art

With the development of semiconductor technology, a junction field effect transistor (JFET) is wide used in varied electrical product.

In a JFET, a channel is formed between a drain and a source. Two gates are disposed at two sides of the channel. The size of a depletion region is controlled by the voltage of the gates, such that the channel can be pitched off and turned off.

The JFET can be used as a fixed current diode or a fixed resistance. Or, the JFET can be used for modulating the voltage in low frequency signal or high frequency signal.

With the development of high voltage semiconductor technology, a high voltage junction field effect transistor (HV JFET) is invented. The researchers try to improve the performance of the HV JFET.

SUMMARY

According to an embodiment of the present disclosure, a junction field effect transistor is disclosed. The junction field effect transistor comprises a first doped region and a second doped region. The first doped region comprises a source and a drain. The second doped region comprises a gate. The first doped region and the second doped region have a U-shape PN junction there between. The U-shape PN junction is between the source and the drain.

According to another embodiment of the present disclosure, a junction field effect transistor is disclosed. The junction field effect transistor comprises a first doped region and a second doped region. The first doped region comprises a source, a drain, and a channel region between the source and the drain. The second doped region comprises a gate and has a conductivity type opposite to a conductivity type of the first doped region. A PN junction between the second doped region and the channel region is shallower than a lower surface of the source.

According to yet another embodiment of the present disclosure, a junction field effect transistor is disclosed. The junction field effect transistor comprises a first well, a drain, a second well, a source and a channel region. The drain is in the first well. The source is in the second well. The channel region is in the second well and has a thickness smaller than a thickness of the source. The channel region is adjoined between the source and the first well. The source is between the channel region and the gate.

The above and other embodiments of the disclosure will become better understood with regard to the following detailed description of the non-limiting embodiment(s). The following description is made with reference to the accompanying drawings.

DETAILED DESCRIPTION

Figure 1A:
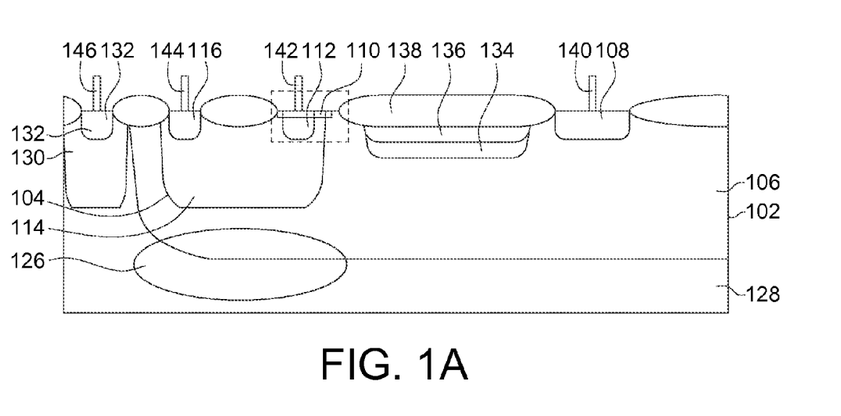
FIG. 1A illustrates a cross-section view of a junction field effect transistor according to one embodiment.

FIG. 1A illustrates a cross-section view of a junction field effect transistor (JFET) according to one embodiment. The junction field effect transistor comprises a first doped region 102 and the second doped region 104. The first doped region 102 comprises a first well 106, a drain 108 on the first well 106, a channel region 110 adjoined with the first well 106, and a source 112 adjoined with the channel region 110, all having a first type conductivity such as N-type conductivity. The second doped region 104 comprises a second well 114 and a gate 116 on the second well 114, all having a second type conductivity such as P-type conductivity opposing to the first type conductivity. As shown in FIG. 1A, the source 112 and the channel region 110 of the first doped region 102 are on the second well 114 of the second doped region 104.

Figure 1B:
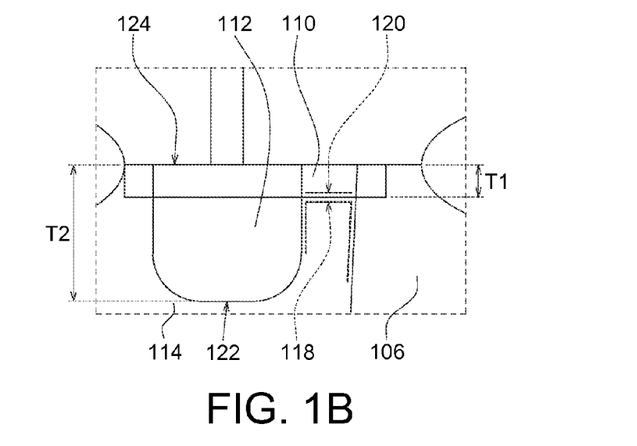
FIG. 1B illustrates an enlarged view of a region near a channel region of a junction field effect transistor according to one embodiment.

Referring to FIG. 1B illustrating an enlarged view of a region near the channel region 110 of FIG. 1A, in embodiments, the second well 114 and the first well 106, the channel region 110 and the source 112 have a U-PN junction 118 there between. The U-shape PN junction 118 has a concave facing down. The U-shape PN junction 118 comprises a substantial plane PN junction 120 between the second well 114 and the channel region 110. The PN junction 120 is shallower than a lower surface 122 of the source 112. Alternatively, the PN junction 120 of the second well 114 and the channel region 110 is between the lower surface 122 and an upper surface 124 of the source 112. A thickness T1 of the channel region 110 is smaller than a thickness T2 of the source 112.

Referring to FIG. 1A, a buried layer 126 may be between the first well 106 and a semiconductor substrate 128. The buried layer 126 may have the first type conductivity such as N-type conductivity. A third well 130 may be on the semiconductor substrate 128. A heavily-doped region 132 may be on the third well 130. The semiconductor substrate 128, the third well 130 and the heavily-doped region 132 may have the second type conductivity such as P-type conductivity. A first top doped layer 134 may be on the first well 106 between the drain 108 and the channel region 110. A second top doped layer 136 may be on the first top doped layer 134 and have a conductivity type opposite to a conductivity type of the first top doped layer 134. In one embodiment, the first top doped layer 134 has the second type conductivity such as P-type conductivity. The second top doped layer 136 has the first type conductivity such as N-type conductivity. An insulating structure 138 may be on the second top doped layer 136 between the drain 108 and the channel region 110, on the second well 114 between the source 112 and the gate 116, and between the gate 116 and the heavily-doped region 132, or other suitable regions.

The junction field effect transistor may be operated by a method comprising following steps. Voltages may be applied to the drain 108, the source 112 and the gate 116 through conductive contact 140, 142, 144, so as to generate a depletion region between the second well 114 and the channel region 110, and change a thickness of the channel region 110 allowing carriers (such as electrons) to pass there through. For example, the applied voltages induce a bias Vds and a bias Vgd, and the biases are controlled to pinch off the channel region 110. A bulk voltage can be applied and controlled through a conductive contact 146.

Figure 2:
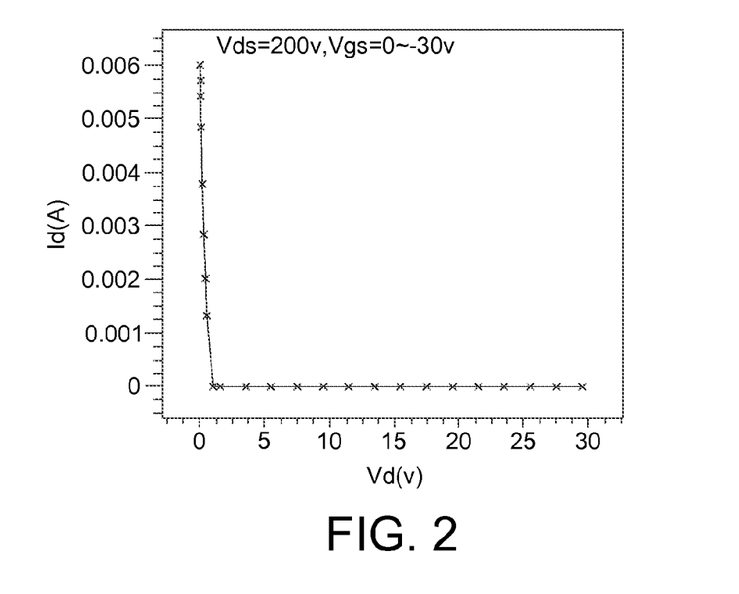
FIG. 2 to FIG. 4 are electrical curves of a junction field effect transistor according to one embodiment.
Figure 3:
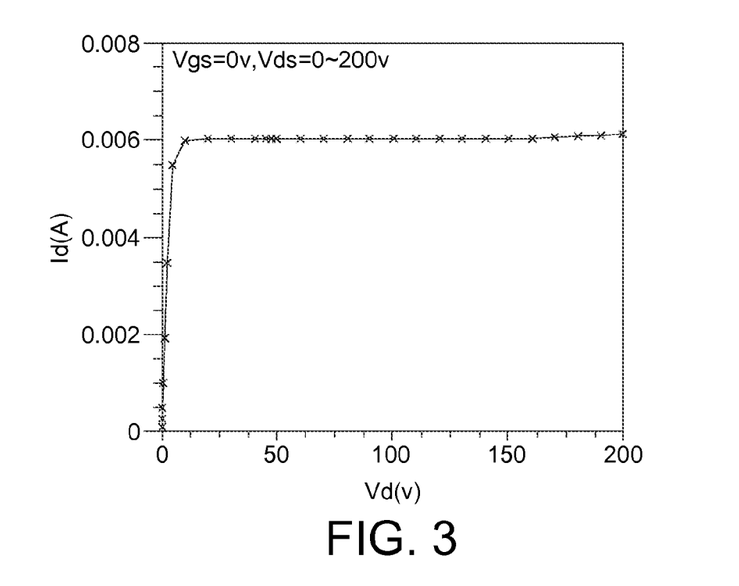
Figure 4:
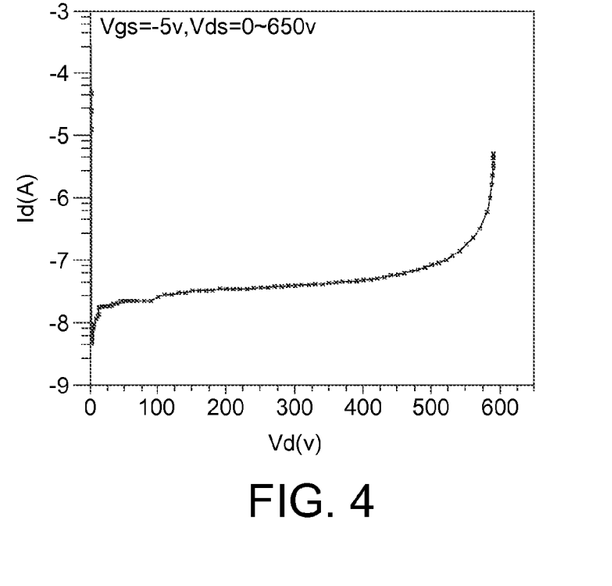

FIG. 2 to FIG. 4 are electrical curves of the junction field effect transistor according to one embodiment. The figures show that a pinch voltage Vpinch is 1V (FIG. 2). When a drain voltage Vd is 200V, a drain current Id is 6 mA (FIG. 3). In addition, a breakdown voltage of the device is 590V. In embodiments, the junction field effect transistor can be applied to ultra-high voltage (300V~1000 V) devices.

Figure 5A:
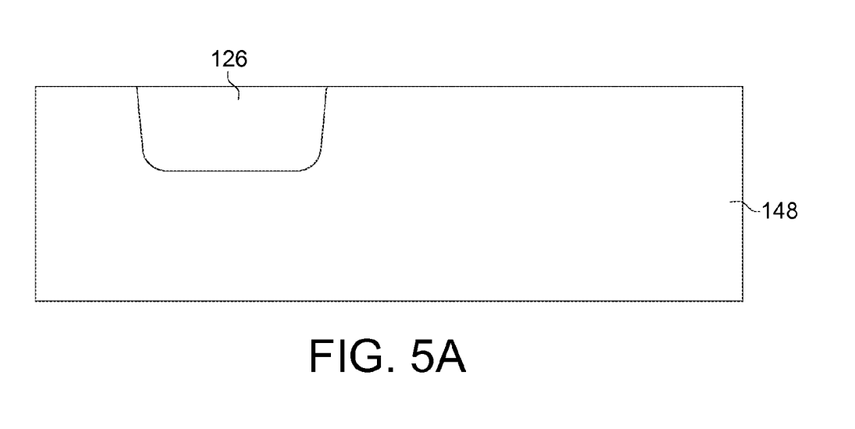
FIG. 5A and FIG. 5J illustrate a process to manufacture a junction field effect transistor according to one embodiment.
Figure 5B:
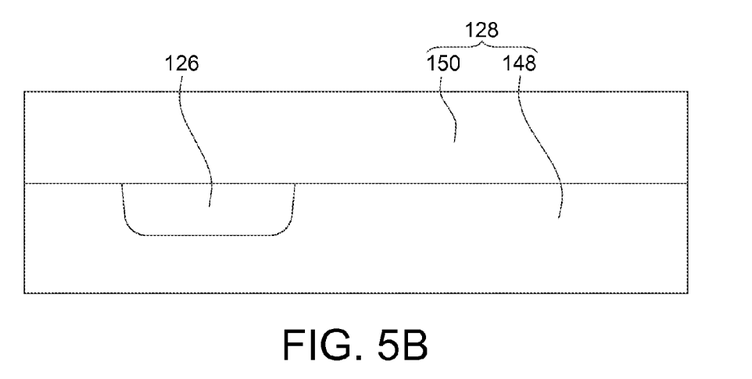
Figure 5C:
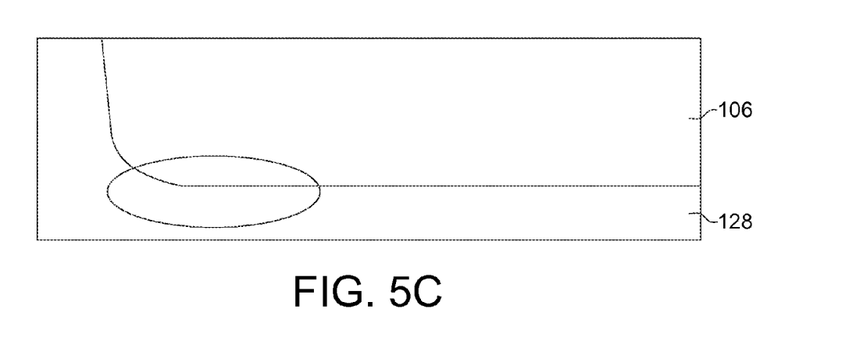
Figure 5D:
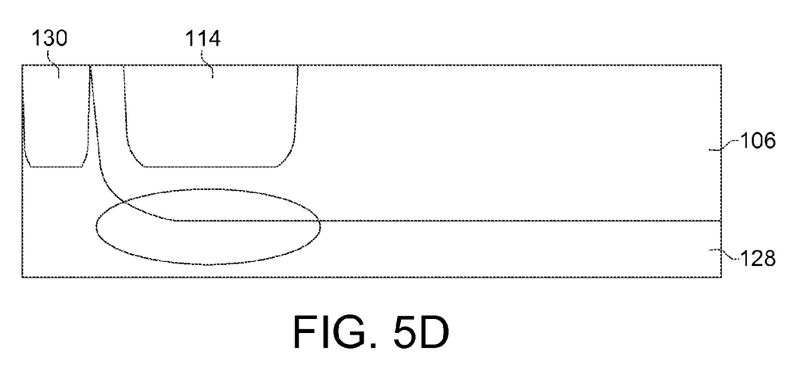
Figure 5E:
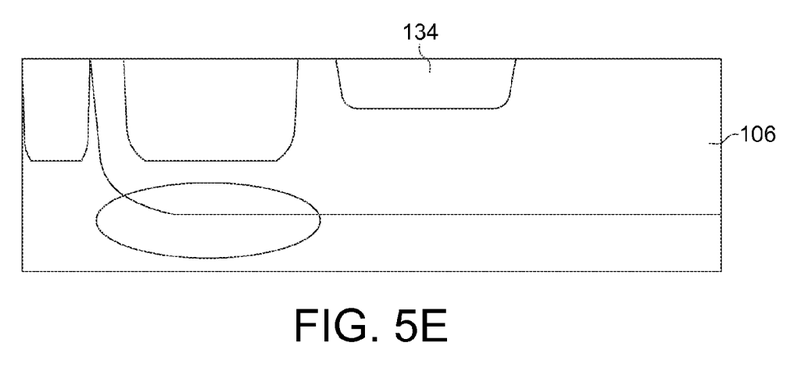
Figure 5F:
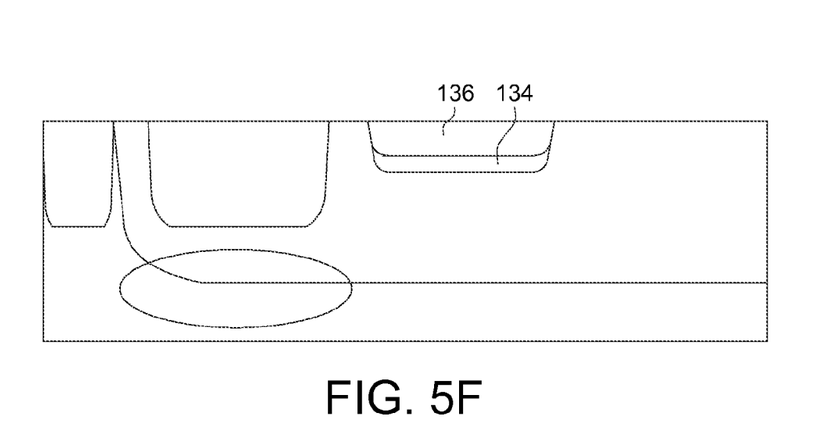
Figure 5G:
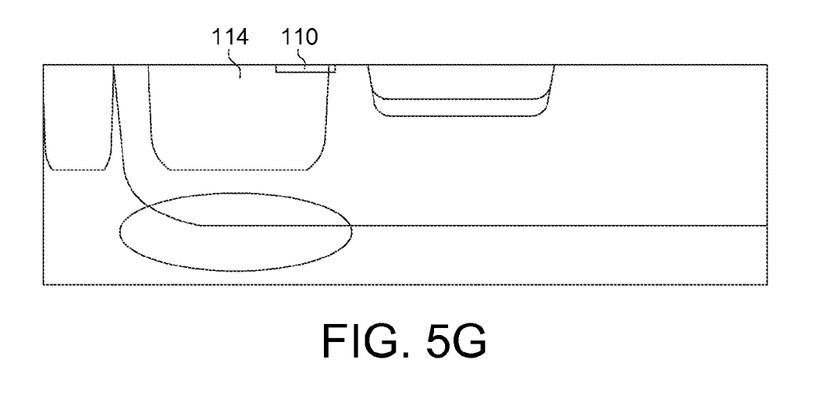
Figure 5H:
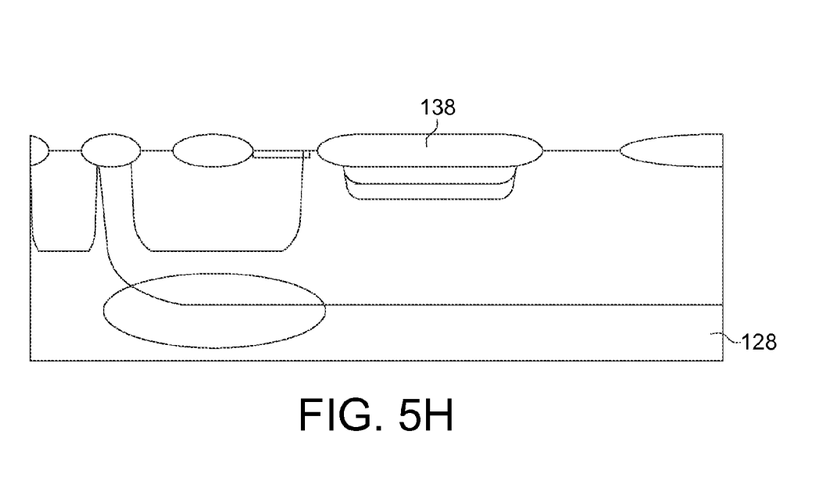
Figure 5I:
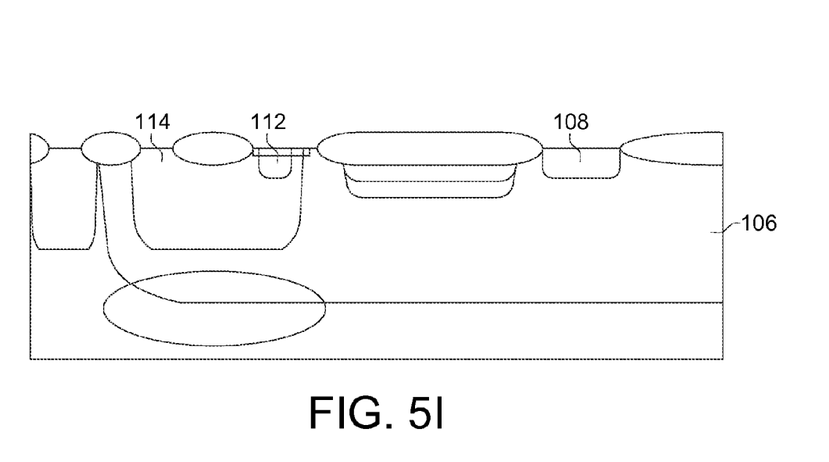
Figure 5J:
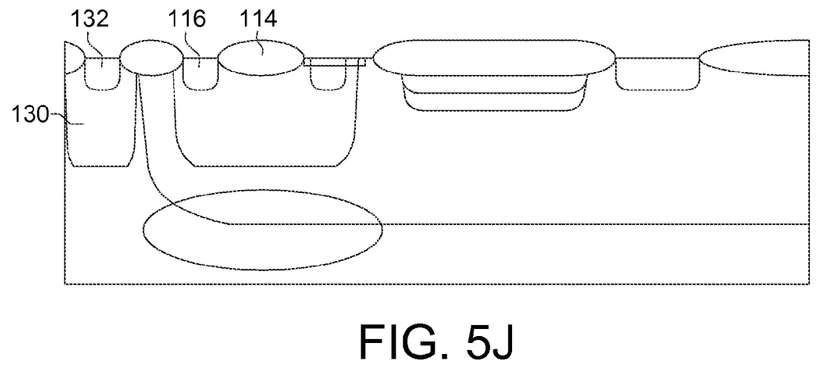

FIG. 5A and FIG. 5J illustrate a process to manufacture the junction field effect transistor as shown in FIG. 1A according to one embodiment.

Referring to FIG. 5A, the buried layer 126 is formed in a substrate 148. The substrate 148 may comprise a silicon substrate, a SOI structure, or other suitable materials. The buried layer 126 may be formed by doping the substrate 148. A thermal diffusion process may be performed to the buried layer 126.

Referring to FIG. 5B, an epitaxial layer 150 may be formed on the substrate 148 and the buried layer 126. The semiconductor substrate 128 comprises the substrate 148 and the epitaxial layer 150.

Referring to FIG. 5C, the first well 106 is formed in the semiconductor substrate 128. The first well 106 may be formed by a doping method which may be followed by a thermal diffusion step.

Referring to FIG. 5D, the second well 114 is formed in the first well 106. In addition, the third well 130 is formed in the semiconductor substrate 128. The second well 114 and the third well 130 may be formed by a doping method which may be followed by a thermal diffusion step. In one embodiment, the second well 114 and the third well 130 having the same second type conductivity are formed at the same time by a lithograph process with a single photo resist mask. In other embodiments, the second well 114 and the third well 130 may be formed by respective doping processes.

Referring to FIG. 5E, the first top doped layer 134 may be formed in the first well 106 by a doping method.

Referring to FIG. 5F, second top doped layer 136 may be formed in the first top doped layer 134 by a doping method.

Referring to FIG. 5G, the channel region 110 may be formed in the second well 114 by a doping method.

Referring to FIG. 5H, the insulating structure 138 is formed on the semiconductor substrate 128. In one embodiment, the insulating structure 138 is a FOX structure.

Referring to FIG. 5I, the drain 108 is formed in the first well 106. In addition, the source 112 is formed in the second well 114. In one embodiment, the heavily-doped drain 108 and source 112 having the same first type conductivity are formed at the same time by a lithography process with a single photo resist mask.

Referring to FIG. 5J, the gate 116 is formed in the second well 114. In addition, the heavily-doped region 132 is formed in the third well 130. In one embodiment, the heavily-doped gate 116 and the heavily-doped region 132 having the same second type conductivity are formed at the same time by a lithography process with a single photo resist mask. In other embodiments, the gate 116 and the heavily-doped region 132 may be formed by different doping processes.

Referring to FIG. 1A, the conductive contacts 140, 142, 144 and 146 are formed to electrically connect to doped elements comprising the drain 108, the source 112, the gate 116 and the heavily-doped region 132, respectively. In embodiments, the conductive contacts 140, 142, 144 and 146 are conductive elements having good electric conductivity and being able to form ohmic contact connection with the drain 108, the source 112, the gate 116 and the heavily-doped region 132. The conductive element may comprise a metal silicide contact, a metal plug passing through an ILD, metal layers of various levels (such as a first-layer metal M1, a second-layer metal M2, etc) on the ILD, for electrically connect the doped elements to external or other devices.

The present disclosure is not limited to the illustrations referring to the figure, and can be varied according to actual demands and other designs. In some embodiment, the channel region 110 may be formed after the insulating structure 138, and formed by using the insulating structure 138 as a doping mask. The doped elements are not limited to the disclosed doping sequence. For example, the source 112 and the drain 108 may be formed after the gate 116 and the heavily-doped region 132. The insulating structure 138 may use a shallow trench isolation, a deep trench isolation, or other suitable dielectric structures.

Although the embodiments are disclosed as a N-channel junction field effect transistor, the concepts for which can also applied to a P-channel device.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A junction field effect transistor (JFET), comprising:
   a first doped region comprising a source, drain, a first well and a channel region; and
   a second doped region comprising a gate, wherein the first doped region and the second doped region have a U-shape PN junction there between, the U-shape PN junction is between the source and the drain; the channel region is disposed adjacent to the first well and the source; and the channel region, the drain and the source have a first type conductivity.

2. The junction field effect transistor according to claim 1, wherein a concave of the U-shape PN junction between the first doped region and the second doped region faces toward the second doped region.

3. The junction field effect transistor according to claim 1, wherein the second doped region further comprises a second well, the U-shape PN junction is an interface between the second well and the first well, the channel region and the source.

4. The junction field effect transistor according to claim 3, wherein the first well, have a first type conductivity, the gate and the second well have a second type conductivity opposing to the first type conductivity.

5. The junction field effect transistor according to claim 3, wherein the drain is formed in the first well, the gate is formed in the second well.

6. The junction field effect transistor according to claim 1, wherein the first well and a channel region are disposed between the first well and the source.

7. The junction field effect transistor according to claim 1, further comprising a buried layer below the first doped region and the second doped region.

8. The junction field effect transistor according to claim 1, further comprising an insulating structure on the first doped region between the source and the drain.

9. The junction field effect transistor according to claim 1, further comprising an insulating structure on the second doped region between the source and the gate.

10. The junction field effect transistor according to claim 1, further comprising:
    a first top doped layer between the source and the drain; and a second top doped layer on the first top doped layer and having a conductivity type opposite to a conductivity type of the first top doped layer.

11. A junction field effect transistor, comprising:
a first doped region comprising a source, a drain, a first well and a channel region all having a first type conductivity, wherein the channel region is disposed between the source and the drain, and the channel region is disposed adjacent to the first well and the source; and
a second doped region comprising a gate and having a second conductivity type opposite to the first conductivity type of the first doped region, a PN junction between the second doped region and the channel region is shallower than a lower surface of the source.

12. The junction field effect transistor according to claim 11, wherein the PN junction of the second doped region and the cannel region is between the lower surface and an upper surface of the source.

13. The junction field effect transistor according to claim 11, wherein a thickness of the channel region is smaller than a thickness of the source.

14. The junction field effect transistor according to claim 11, wherein the drain is formed in the first well, the channel region is adjoined between the first well and the source.

15. The junction field effect transistor according to claim 11, wherein the second doped region further comprises a second well with the gate formed therein, the channel region is on the second well.

16. The junction field effect transistor according to claim 15, wherein the PN junction is an interface of the channel region and the second well.

17. The junction field effect transistor according to claim 11, further comprising a buried layer below the first doped region and the second doped region.

18. The junction field effect transistor according to claim 11, further comprising an insulating structure on the first doped region between the source and the drain, and/or on the second doped region between the source and the gate.

19. The junction field effect transistor according to claim 11, further comprising:
a first top doped layer between the source and the drain; and
a second top doped layer on the first top doped layer and having a conductivity type opposite to a conductivity type of the first top doped layer.

20. A junction field effect transistor, comprising:
a first well;
a drain in the first well;
a second well;
a source in the second well; and
a channel region in the second well and having a thickness smaller than a thickness of the source, the channel region is adjoined between the source and the first well, the source is between the channel region and the gate, the channel region the drain and the source have a first type conductivity.

* * * * *